(12) United States Patent
Bernier et al.

(10) Patent No.: US 9,902,415 B2
(45) Date of Patent: Feb. 27, 2018

(54) UNIVERSAL SERVICE CART FOR SEMICONDUCTOR SYSTEM MAINTENANCE

(71) Applicant: Lam Research Corporation, Fremont, CA (US)

(72) Inventors: Terrence George Bernier, Hillsboro, OR (US); Joseph Wei, Portland, OR (US); Tony Nguyen, Pleasanton, CA (US)

(73) Assignee: LAM RESEARCH CORPORATION, Freemont, CA (US)

( * ) Notice: Subject to any disclaimer, the term of this patent is extended or adjusted under 35 U.S.C. 154(b) by 0 days.

(21) Appl. No.: 15/234,645

(22) Filed: Aug. 11, 2016

(65) Prior Publication Data
US 2017/0232988 A1 Aug. 17, 2017

Related U.S. Application Data

(60) Provisional application No. 62/295,339, filed on Feb. 15, 2016.

(51) Int. Cl.
*B62B 3/00* (2006.01)
*H01L 21/677* (2006.01)

(52) U.S. Cl.
CPC .............. *B62B 3/005* (2013.01); *B62B 3/004* (2013.01); *H01L 21/67724* (2013.01); *H01L 21/67769* (2013.01)

(58) Field of Classification Search
CPC ........... B62B 3/005; B62B 3/004; B62B 3/00; B62B 3/002; B62B 3/02; B62B 3/04; B62B 3/108; B62B 2202/67; B62B 2203/00; B62B 2203/44; B62B 2203/67; H01L 21/67023; H01L 21/67346; H01L 21/67769; H01L 21/67766; H01L 21/67775; H05K 13/021; H05K 13/0452; H05K 13/04; H05K 13/0053; H05K 13/0061; H05K 13/0069; H05K 13/0084
See application file for complete search history.

(56) References Cited

U.S. PATENT DOCUMENTS

| | | | | |
|---|---|---|---|---|
| 6,033,175 A | * | 3/2000 | Pflueger | B23Q 7/1442 414/396 |
| 6,454,512 B1 | * | 9/2002 | Weiss | B62B 3/006 118/500 |
| 6,494,671 B1 | * | 12/2002 | Takaiti | H05K 13/021 414/396 |

(Continued)

*Primary Examiner* — James M Dolak

(57) ABSTRACT

A service cart for storing components of a substrate processing system includes a first side configured to store a transfer plate removed from the substrate processing system. The first side includes a first mount and a second mount that are spaced apart to retain respective upper portions of the transfer plate. Each of the first mount and the second mount includes a respective groove arranged to retain the upper portions of the transfer plate. The first side further includes a first bumper and a second bumper that are spaced apart to abut respective lower portions of the transfer plate. Each of the first bumper and the second bumper are arranged to retain a desired distance between the first side and the lower portions of the transfer plate. A second side of the service cart includes a drawer or an opening to provide access to an interior of the service cart.

17 Claims, 13 Drawing Sheets

(56) References Cited

U.S. PATENT DOCUMENTS

| | | | | |
|---|---|---|---|---|
| 6,547,473 | B2 * | 4/2003 | Takayama | H01L 21/67724 |
| | | | | 403/25 |
| 6,709,225 | B1 * | 3/2004 | Pitts | H01L 21/67766 |
| | | | | 414/267 |
| 7,066,704 | B2 * | 6/2006 | Endo | H05K 13/021 |
| | | | | 254/2 C |
| 8,657,310 | B2 * | 2/2014 | Pan | H01L 21/67724 |
| | | | | 280/47.35 |
| 8,752,848 | B2 * | 6/2014 | Petrick | H01R 13/465 |
| | | | | 280/47.35 |
| 9,781,870 | B2 * | 10/2017 | Shimizu | H05K 13/043 |
| 9,786,536 | B2 * | 10/2017 | Kudel | A47B 47/0083 |
| 9,788,470 | B2 * | 10/2017 | Shimizu | H05K 13/021 |
| 9,812,343 | B2 * | 11/2017 | Sharrock | H01L 21/67706 |
| 9,815,624 | B2 * | 11/2017 | Yoshioka | B65G 1/06 |
| 9,827,662 | B1 * | 11/2017 | Liu | B25H 1/16 |

* cited by examiner

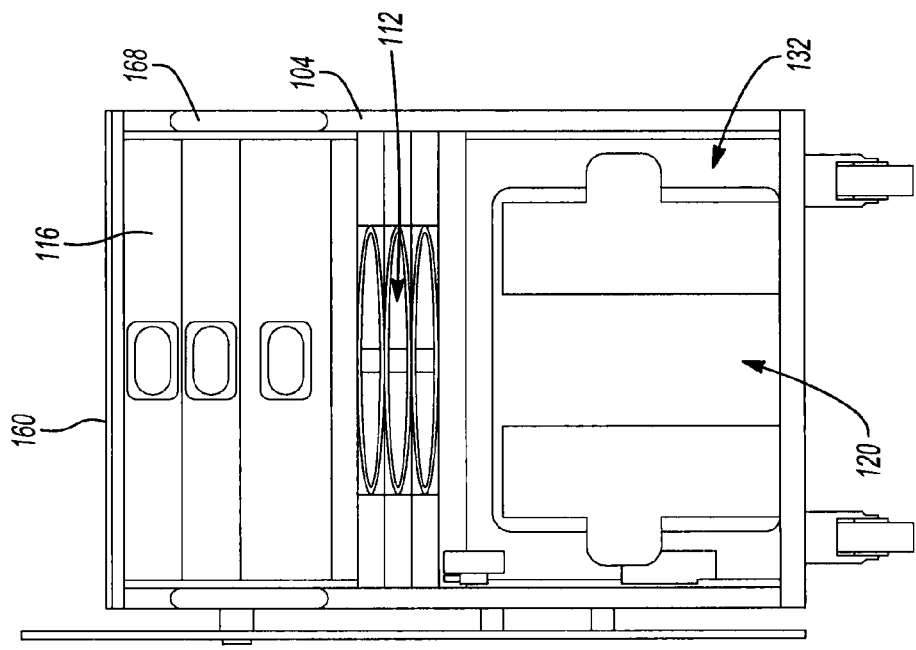
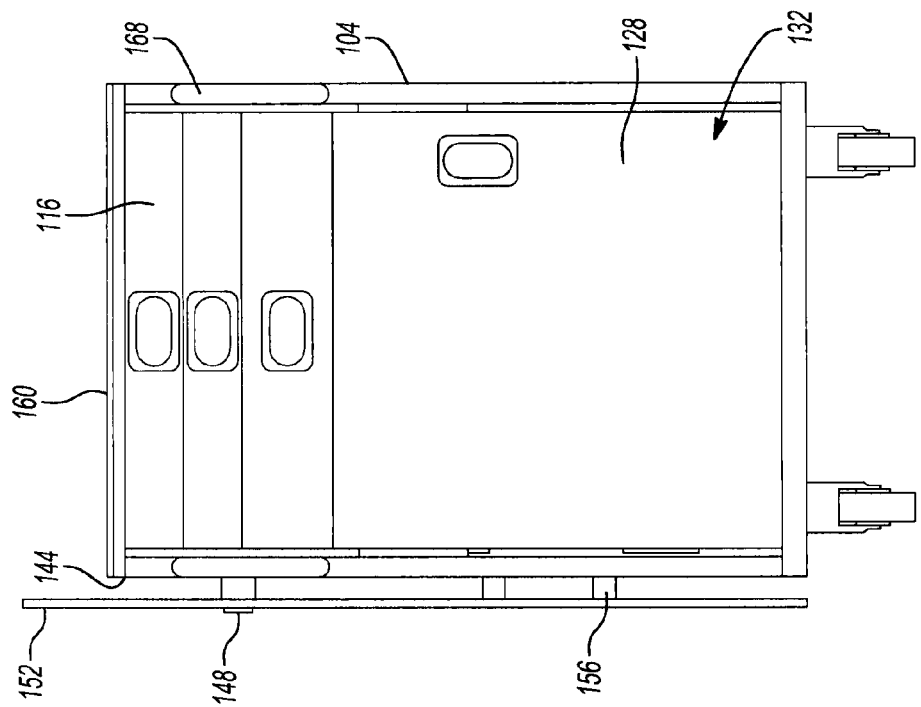

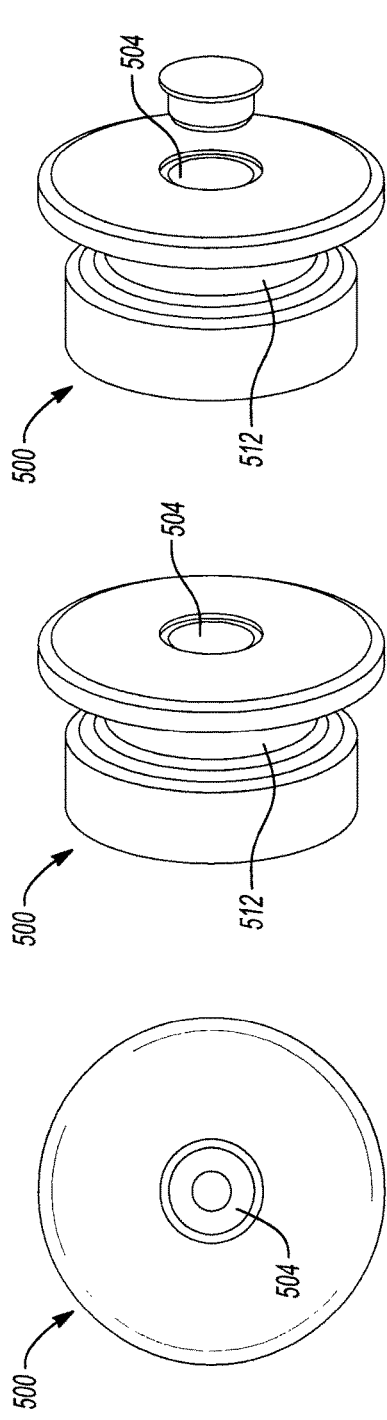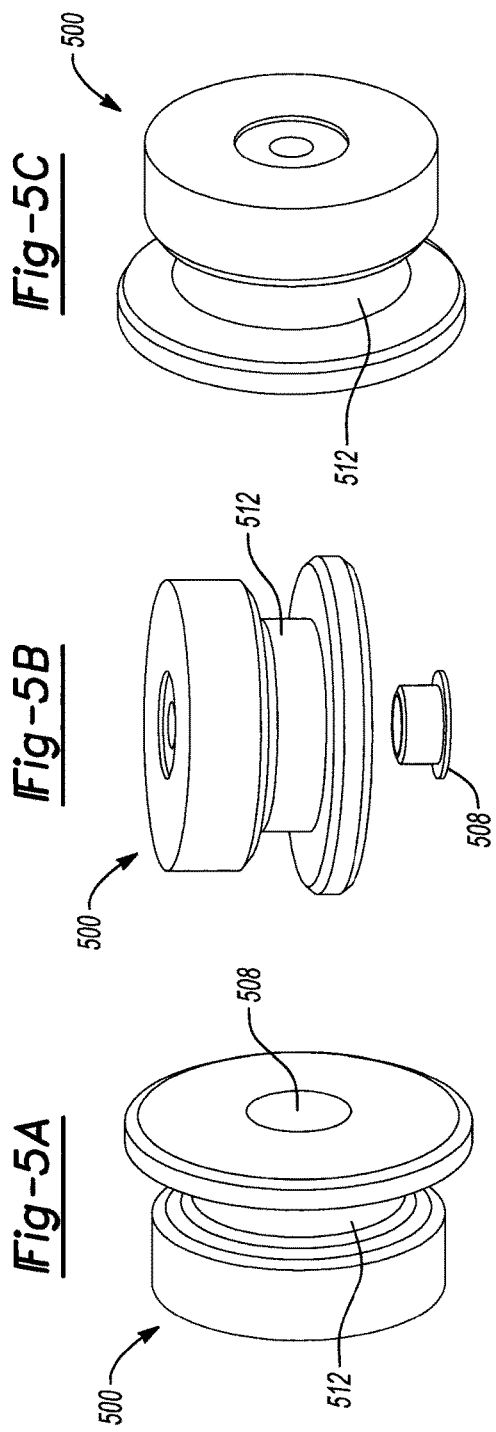

UNIVERSAL SERVICE CART FOR SEMICONDUCTOR SYSTEM MAINTENANCE

CROSS-REFERENCE TO RELATED APPLICATIONS

This application claims the benefit of U.S. Provisional Application No. 62/295,339, filed on Feb. 15, 2016. The entire disclosure of the application referenced above is incorporated herein by reference.

FIELD

The present disclosure relates to systems and methods for storing and organizing components of substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, cleaning, and/or other treatment of substrates such as semiconductor wafers. Example processes that may be performed on a substrate include, but are not limited to, a plasma enhanced chemical vapor deposition (PECVD) process, an atomic layer deposition (ALD) process, a chemically enhanced plasma vapor deposition (CEPVD) process, a sputtering physical vapor deposition (PVD) process, an ion implantation process, and/or other etch (e.g., chemical etch, plasma etch, reactive ion etch, etc.), deposition, and cleaning. A substrate may be arranged on a substrate support, such as a pedestal in a processing chamber of the substrate processing system. For example only, during deposition, a gas mixture including one or more precursors is introduced into the processing chamber and plasma is struck to deposit films on the substrate.

SUMMARY

A service cart for storing components of a substrate processing system includes a first side configured to store a transfer plate removed from the substrate processing system. The first side includes a first mount and a second mount. The first mount and the second mount are spaced apart to retain respective upper portions of the transfer plate, and each of the first mount and the second mount includes a respective groove arranged to retain the upper portions of the transfer plate. The first side further includes a first bumper and a second bumper. The first bumper and the second bumper are spaced apart to abut respective lower portions of the transfer plate, and each of the first bumper and the second bumper are arranged to retain a desired distance between the first side and the lower portions of the transfer plate. The service cart includes a second side including at least one of a drawer and an opening to provide access to an interior of the service cart.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 1A-1H show an example service cart according to the principles of the present disclosure;

FIGS. 5A-5F show an example transfer plate mount according to the principles of the present disclosure;

In the drawings, reference numbers may be reused to identify similar and/or identical elements.

DETAILED DESCRIPTION

Figure 1A:
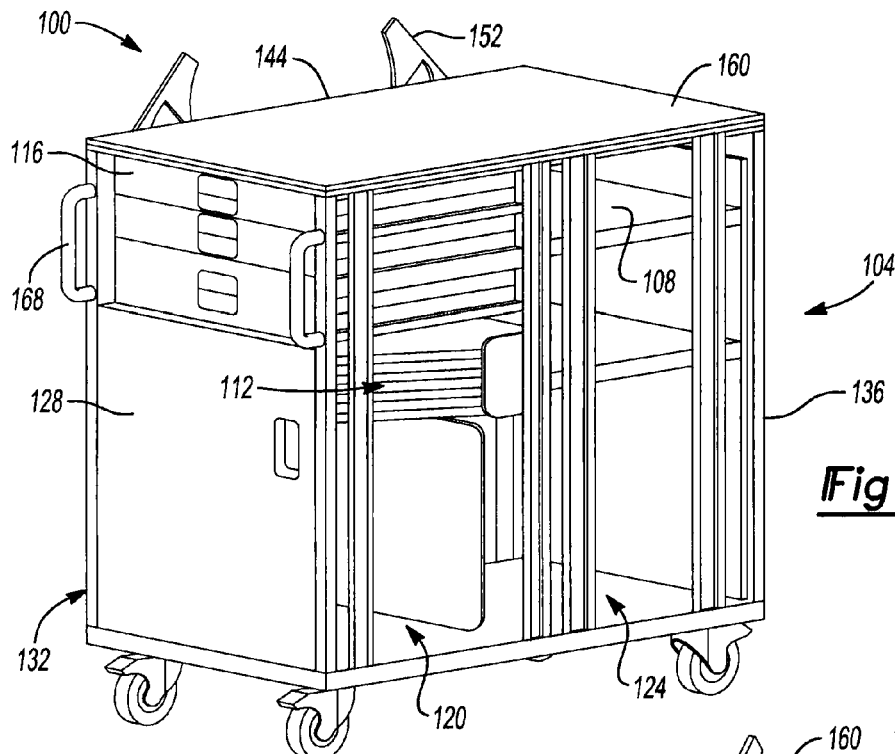
Figure 1B:
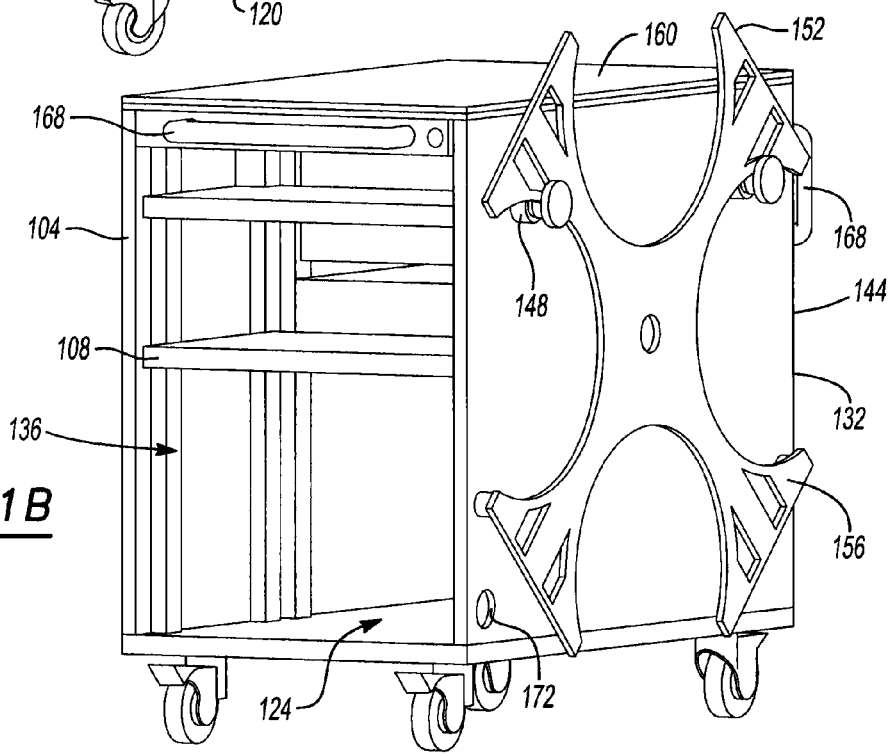
Figure 1C:
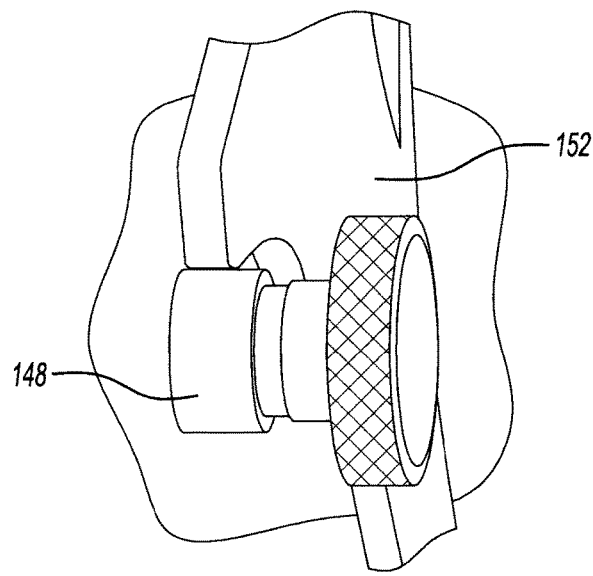

A substrate processing system generally requires periodic servicing including cleaning, maintenance, etc. Cleaning and maintenance may include disassembly and reassembly of various components of the substrate processing system, as well as temporary storage of components removed from the substrate processing system. The components include, but are not limited to, process critical components that may be easily damaged, large, bulky or irregularly shaped components (e.g., a transfer plate of the substrate processing system), and components having a large range of sizes and storage requirements.

Systems and methods according to the principles of the present disclosure provide a service cart configured to store tools and other items related to servicing a substrate processing system. For example, the cart may be configured specifically for servicing a wet clean optimization (WCO) deposition substrate processing system or tool. The cart provides storage for all components and tools associated with performing cleaning, maintenance, etc. of a particular substrate processing system, including storage for components that are removed from the system during servicing. In some examples, different sides of the cart provide access to different storage compartments and/or tools. For example, a first side of the cart may provide access to tools associated with a service or cleaning step (e.g., in a set of tool drawers arranged on the first side) while a second side opposite or adjacent to the first side may provide access to other stored tools and components. In this manner, the cart allows access to various components and tools without interrupting servicing being performed using tools on the other side of the cart, a work surface of the cart, etc.

The interior of the cart includes protective storage for carrier rings (e.g., ceramic carrier rings) and MCA (minimum contact area) features of the substrate processing system, as well as storage for larger items, such as a calibration front opening unified pod (FOUP). The cart may include a mount to support a WCO tablet and a charging interface to provide charging of the tablet.

Typically, a transfer plate of certain types of substrate processing systems is a large, irregularly-shaped aluminum plate. One or more sides of the cart include mounts for storing and servicing the transfer plate.

Each of the tool drawers may include one or more cutouts configured to store respective tools. The tool drawers are configured to be in a locked or unlocked state, and may be unlocked when a door to an interior of the cart is locked. Accordingly, the tool drawers can be accessed without opening the door.

The cart may further include adjustable storage shelves, a power cord, and/or a remote charging battery pack. The cart may also be configured to allow for future expansion, including, but not limited to, a longer or adjustable push bar, additional shelves, articulating or actuated flat panel monitors, hidden flat panel monitors, etc.

Figure 1D:
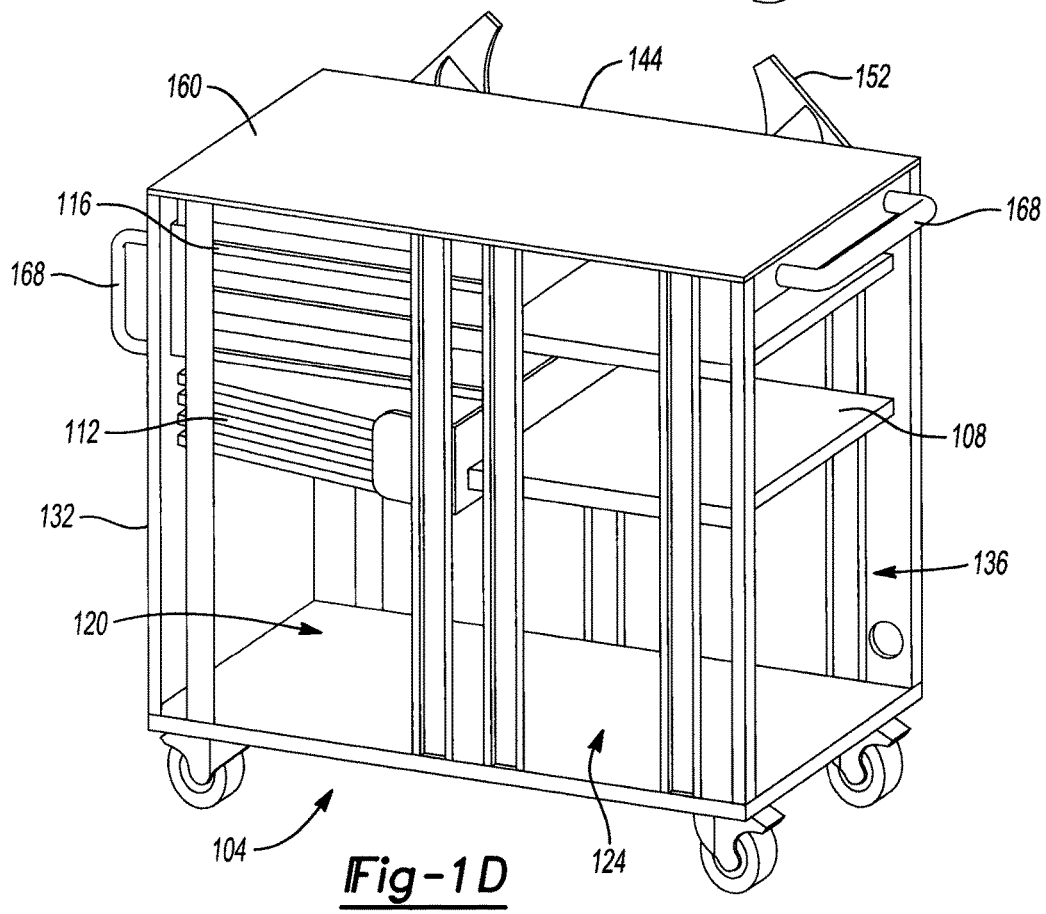
Figure 1G:
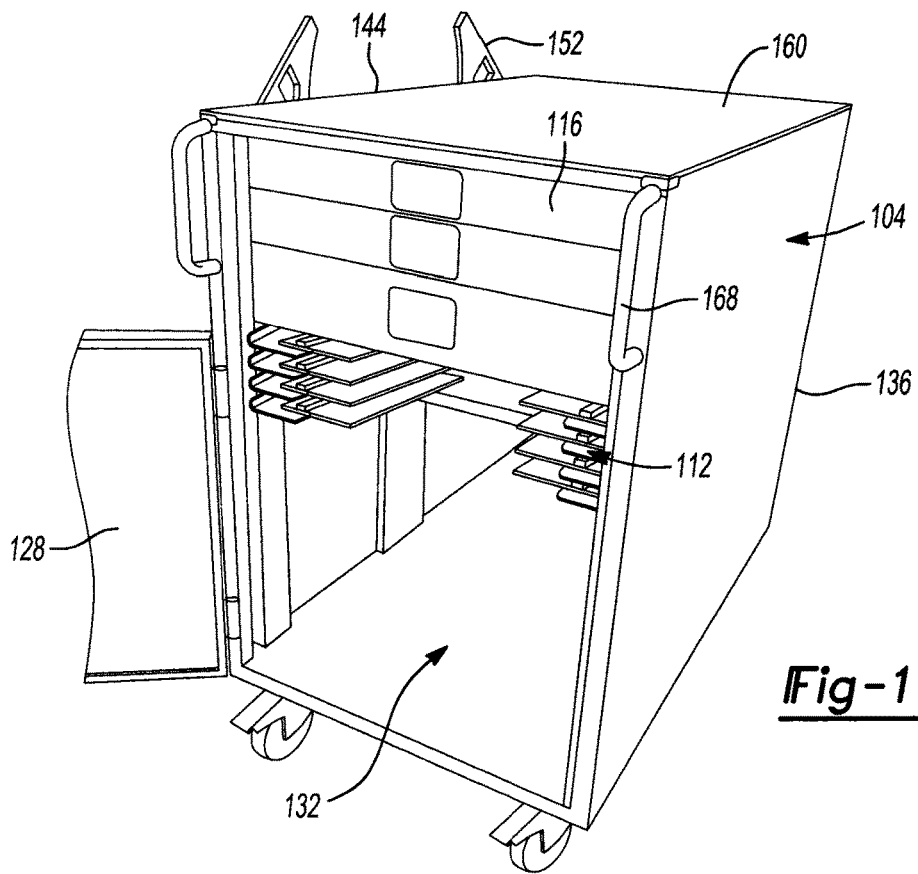
Figure 1H:
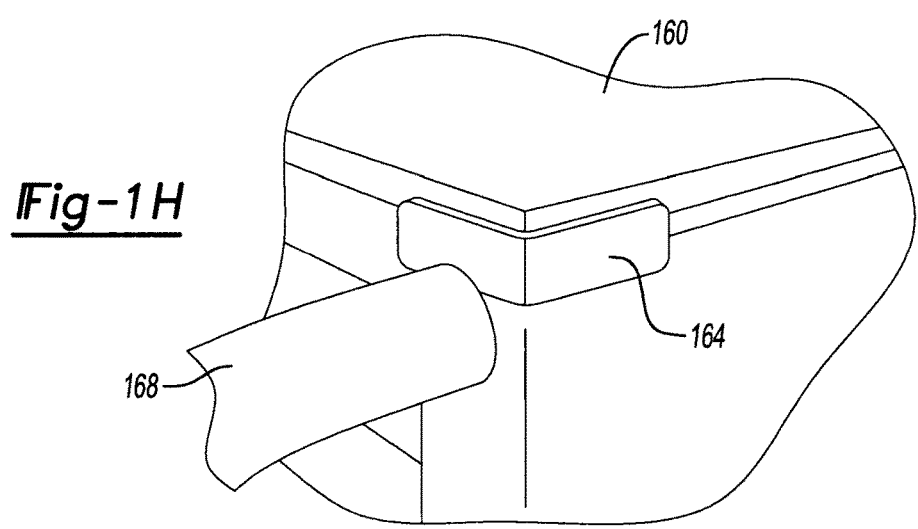

Referring now to FIGS. 1A-1H, various views of an example service cart 100 according to the principles of the present disclosure are shown. For example, the cart 100 may be configured for servicing a WCO deposition substrate processing system or tool. The cart 100 is wheeled to facilitate access to a substrate processing system. In FIGS. 1A and 1D, an interior of the cart 100 is shown in cutaway through a front side 104 of the cart 100 to provide a view of one or more adjustable shelves 108, carrier ring storage 112 (including for example, shelves or ledges configured to accept respective carrier rings), tool drawers 116, FOUP storage 120, and/or additional large item storage 124. The tool drawers 116 and the FOUP storage 120 (e.g., using door 128) are accessible on a first side 132 of the cart 100 while the adjustable shelves 108 and storage 124 are accessible on a second side 136 of the cart 100 opposite the first side 132. For example only, a top one of the drawers 116 may include cutouts for common tools, a middle one of the drawers 116 may be configured to store MCA features, and a bottom one of the drawers 116 may include cutouts for specialized tools. For example only, the cart 100 is constructed from stainless steel (e.g., 316 stainless steel).

A back side 144 of the cart 100 includes one or more mounts 148 positioned to mount a transfer plate 152 (e.g., a vented, non-vented, or spider transfer plate), and one or more bumpers 156 arranged to retain a desired distance between the transfer plate 152 and the back side 144. As shown in more detail in FIG. 1H, the cart 100 may include a removable/replaceable upper work surface 160. The work surface 160 may include a material that provides electrostatic discharge (ESD) protection. The cart 100 includes retention tabs 164 at respective corners to retain the position of the work surface 160. The tabs 164 may be provided only at the respective corners to minimize particle trapping between the work surface 160 and the tabs 164. The cart 100 may include one or more handles or push bars 168 for transporting the cart 100.

The back side 144 may include a power cord inlet hole 172. For example, a power strip (e.g., a 15A power strip including GFI outlets and surge protection) may be mounted in the interior of the cart 100.

Figures 2A, 2B:
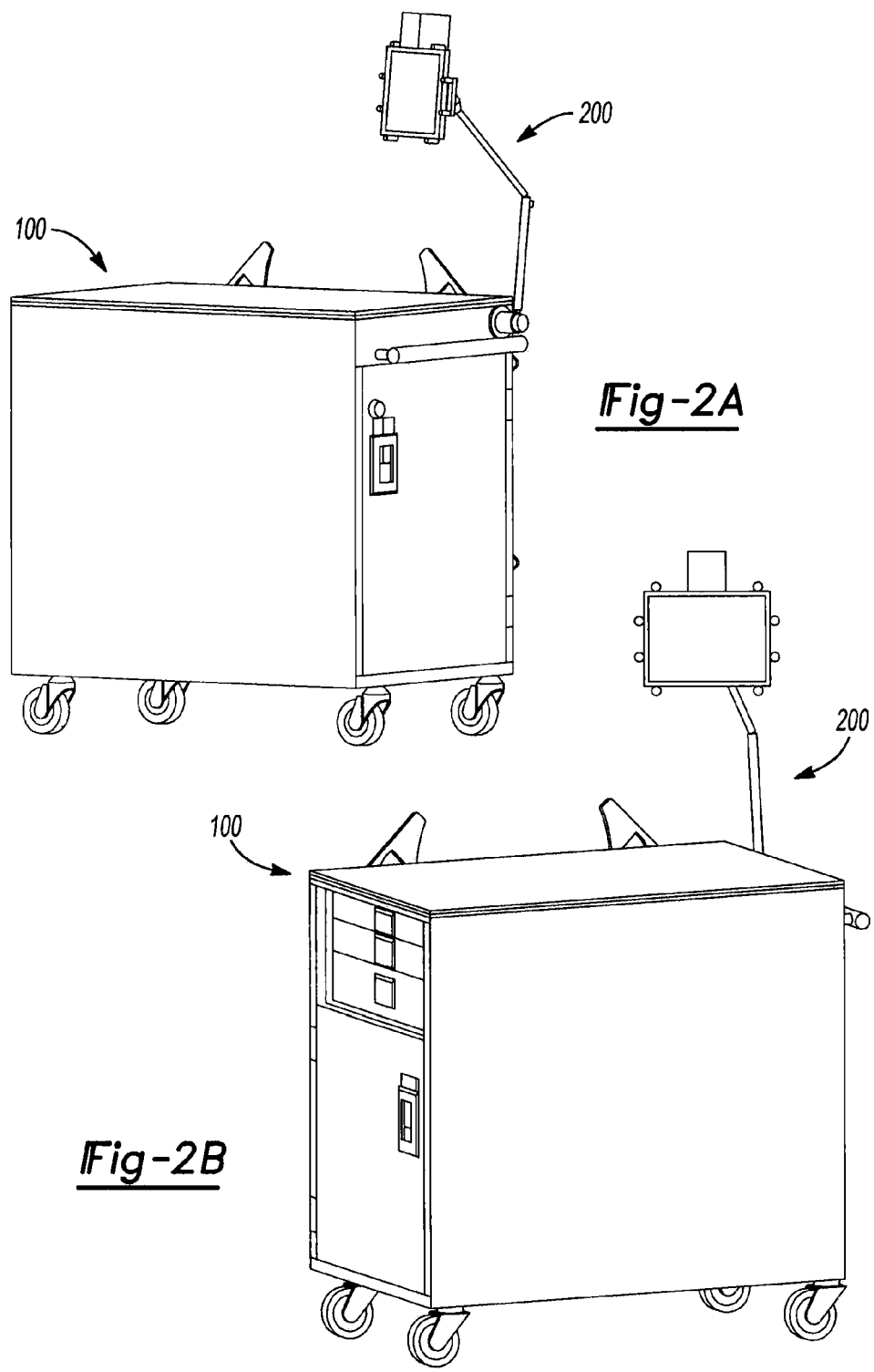
FIGS. 2A-2C show another example service cart according to the principles of the present disclosure.
Figure 2C:
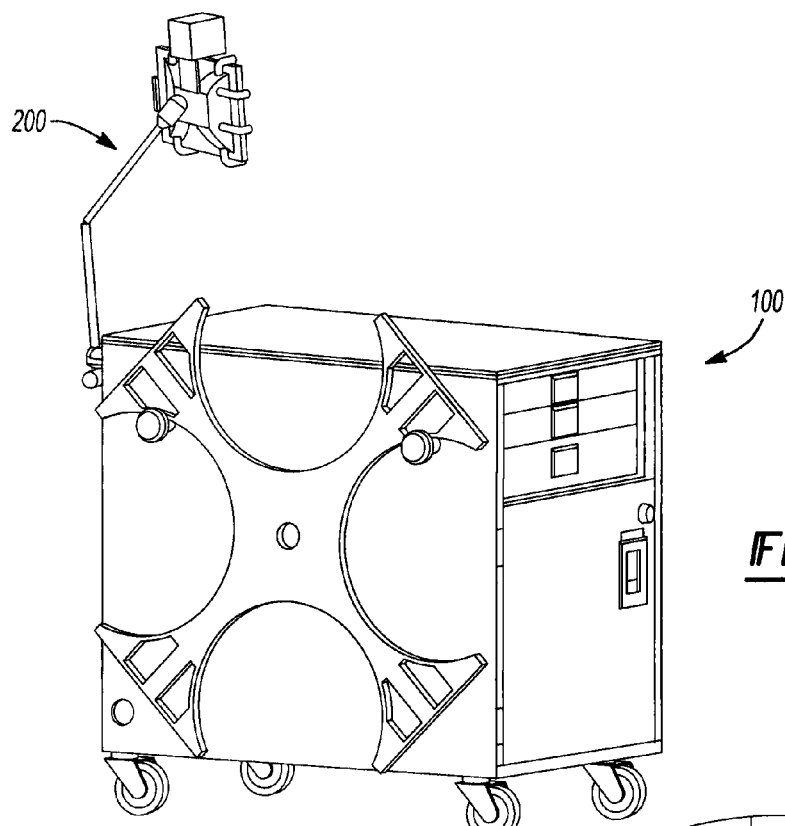

FIGS. 2A-2C show views of another example configuration of the cart 100. In FIGS. 2A-2C, the cart 100 includes an articulating/hinged mounting arm and bracket 200 for mounting a monitor, tablet, or other electronic device to the cart 100.

Figure 3:
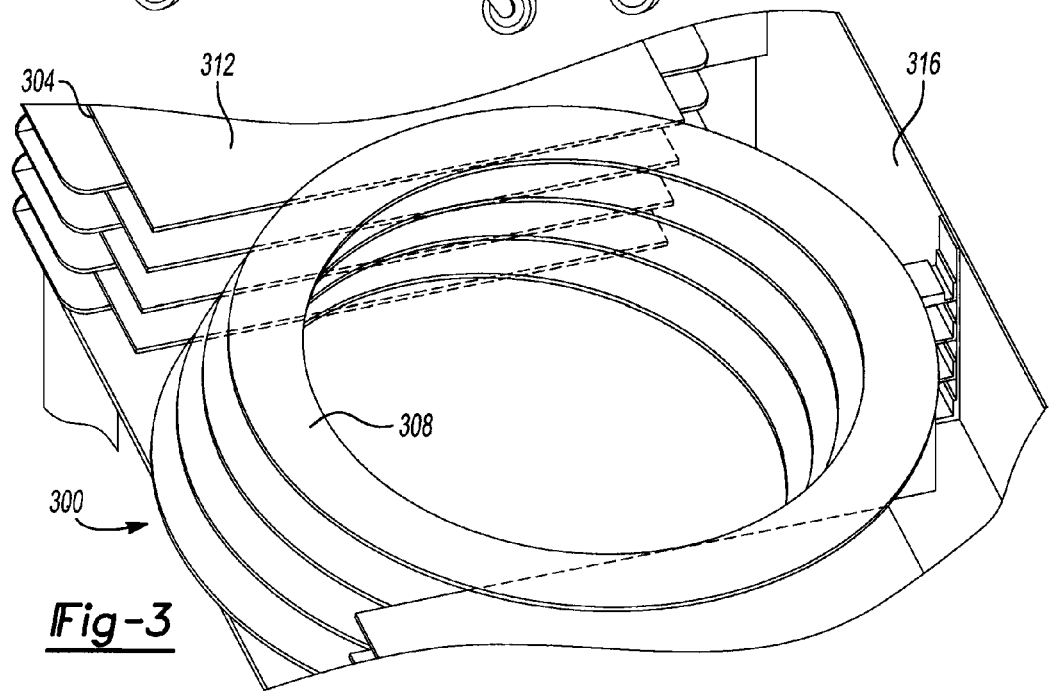
FIG. 3 shows an example carrier ring storage according to the principles of the present disclosure.

FIG. 3 shows an example carrier ring storage 300. The carrier ring storage 300 includes one or pairs of shelves or ledges 304 arranged to accept respective carrier rings 308. As shown, the carrier ring storage 300 includes four sets of the ledges 304. The ledges 304 may include liners 312 made of a material that will prevent damage to the carrier rings 308 (e.g., Teflon, PTFE, etc.). The ledges 304 may be tilted (e.g., with a 5% tilt) backward/downward to prevent the carrier rings 308 from sliding outward. The carrier ring storage 300 includes a barrier 316 (which may also be formed from Teflon or another non-abrasive material) to retain the carrier rings 308 on the ledges 304. In other words, the barrier 316 prevents the carrier rings 308 from sliding backward off of the ledges 304 and further into an interior of the cart 100.

Figure 4A:
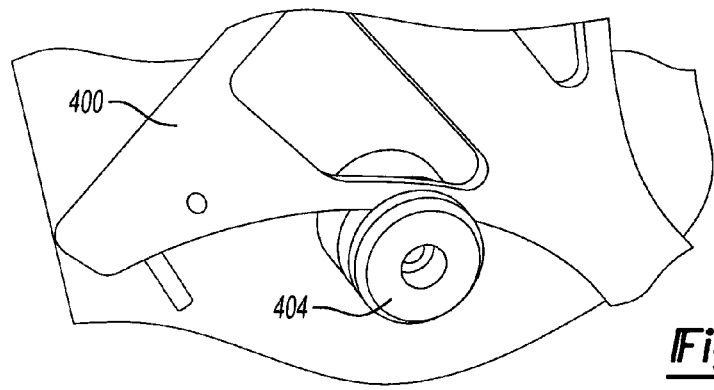
FIGS. 4A-4C show an example transfer plate mounted on a service cart according to the principles of the present disclosure.
Figure 4B:
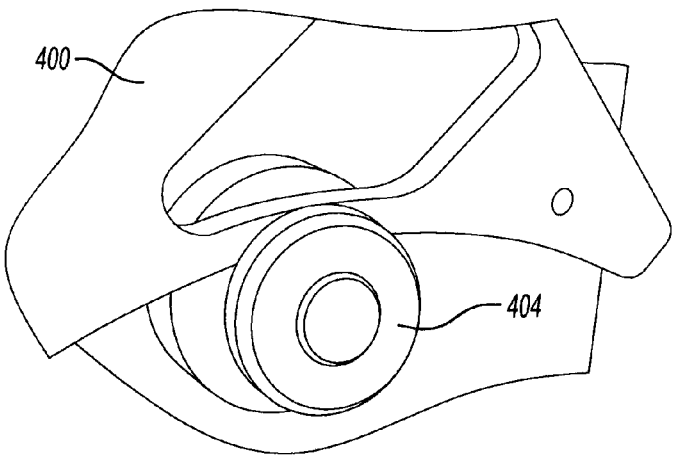
Figure 4C:
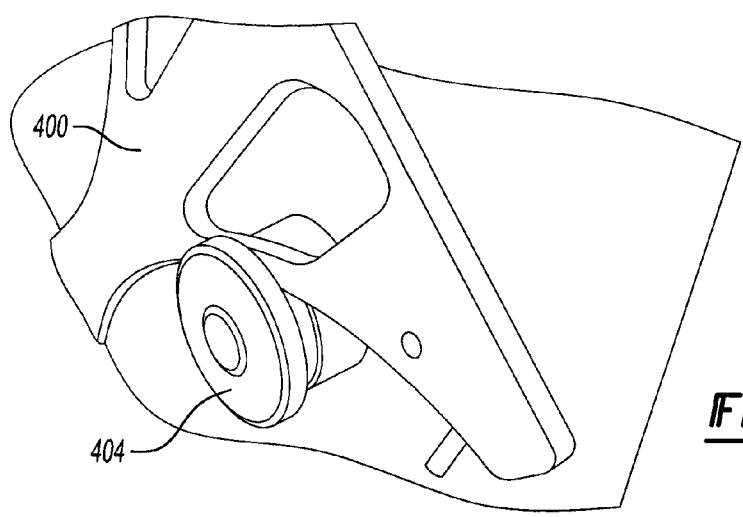
Figure 6A:
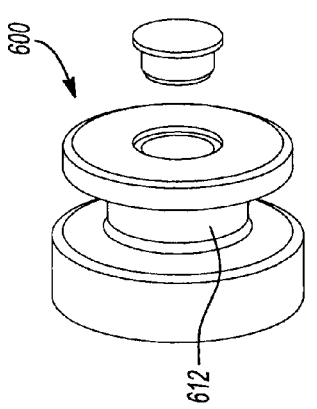
FIGS. 6A-6C show another example transfer plate mount according to the principles of the present disclosure.
Figure 7A:
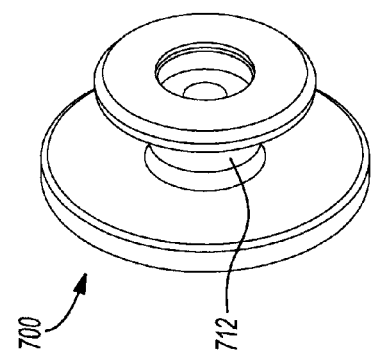
FIGS. 7A-7C show another example transfer plate mount according to the principles of the present disclosure.
Figure 6B:
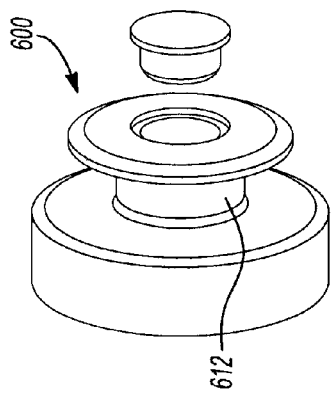
Figure 7B:
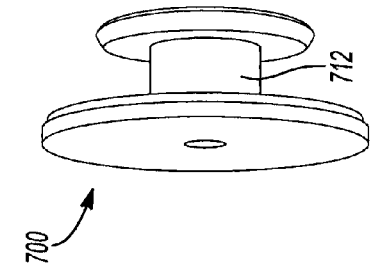
Figure 6C:
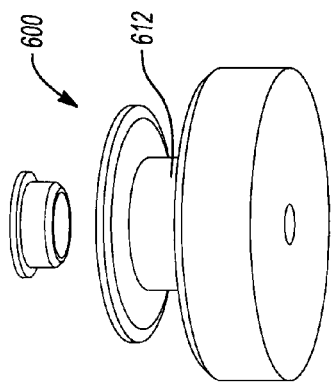
Figure 7C:
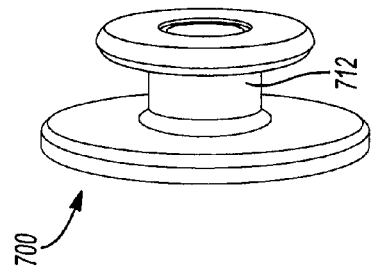

FIGS. 4A-4C show close-up views of a transfer plate 400 mounted on example mounts 404. FIGS. 5A-5F illustrate a first example mount 500. The mount 500 may be connected to a side of the cart 100 using a bolt or other fastener inserted through bolt hole 504. A cap 508 may be provided to cover the bolt hole 504. FIGS. 6A-6C show another example mount 600. FIGS. 7A-7C show still another example mount 700. The mounts 500, 600, and 700 may be formed from plastic or other non-abrasive materials including, but not limited to, PLA, HDPE, Teflon, etc. The mounts 500, 600, and 700 each include respective grooves 512, 612, and 712 arranged to secure the transfer plate a desired distance from the side of the cart 100 and to prevent the transfer plate from bumping the cart. The mounts 500, 600, 700 are positioned to receive and retain an upper portion of the transfer plate. Conversely, bumpers 156 are arranged to about a lower portion of the transfer plate as shown in FIG. 1E to prevent the transfer plate from bumping the side of the cart 100. The bumpers 156 may be cone-shaped and formed from rubber or other suitable material.

Figure 8:
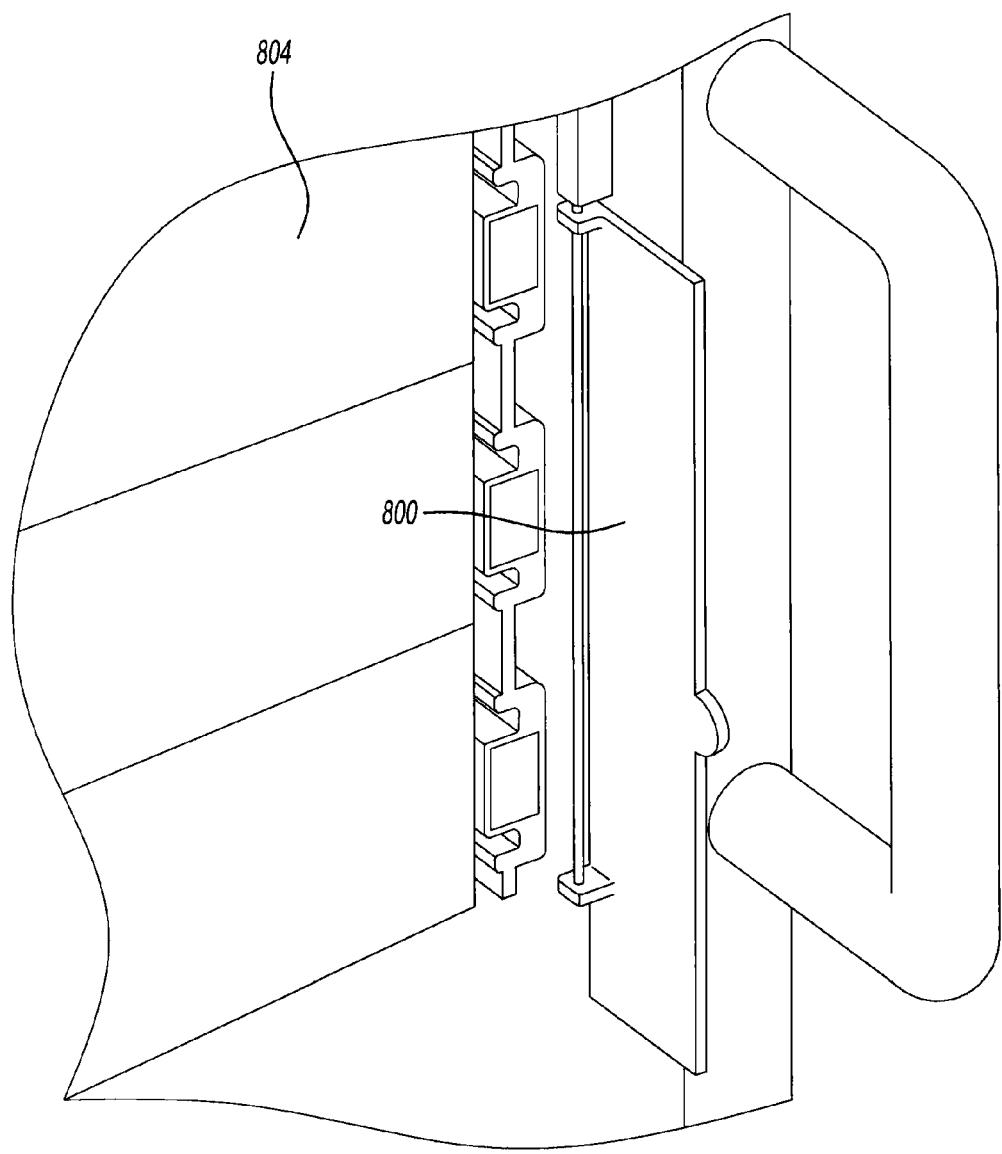
FIG. 8 shows an example drawer latch according to the principles of the present disclosure.

FIG. 8 shows an example hinged latch 800 for selectively locking drawers 804. The latch 800 is configured to actuate between an opened position and a closed position. With the latch 800 in the opened position as shown, the drawers 804 are unlocked. Accordingly, even if a door is closed over the lower storage region and locked, the drawers 804 can still be opened because the latch 800 does not prevent movement of the drawers 804. Conversely, if the latch 800 is closed and the door is closed and locked, the door overlaps and captures a portion of the latch 800 extending below a top of the door. In other words, the door captures and retains the latch 800 in the closed position. Accordingly, the drawers 804 are also locked if the latch 800 is closed and the door is closed and locked over the latch 800.

Figure 9:
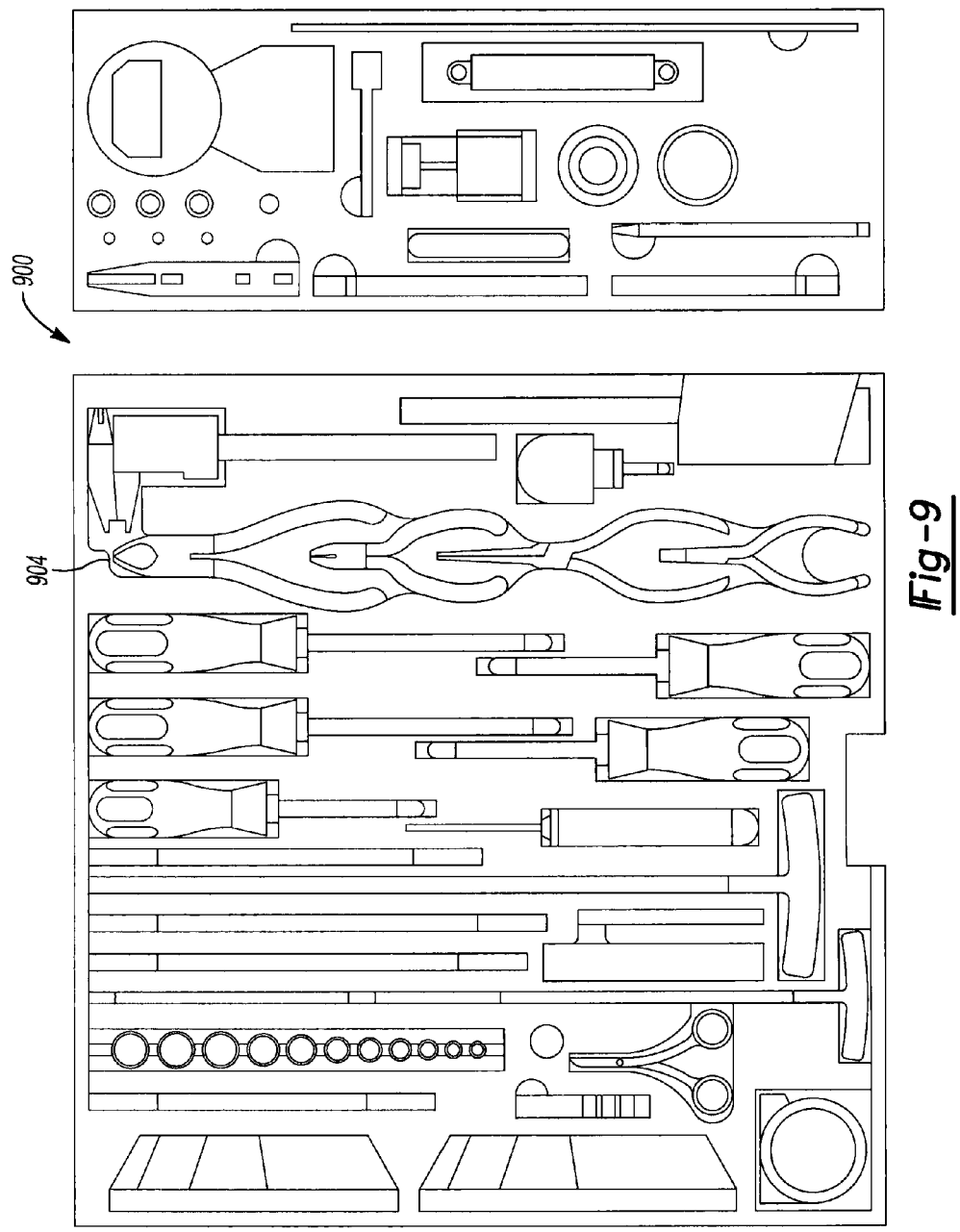
FIG. 9 shows example tool trays according to the principles of the present disclosure.

FIG. 9 shows example trays 900 provided within the tool drawers. The trays 900 include a plurality of cutouts 904 configured to store various tools and components. For example, each of the cutouts 904 has a similar shape as a respective one of the tools.

Figure 10:
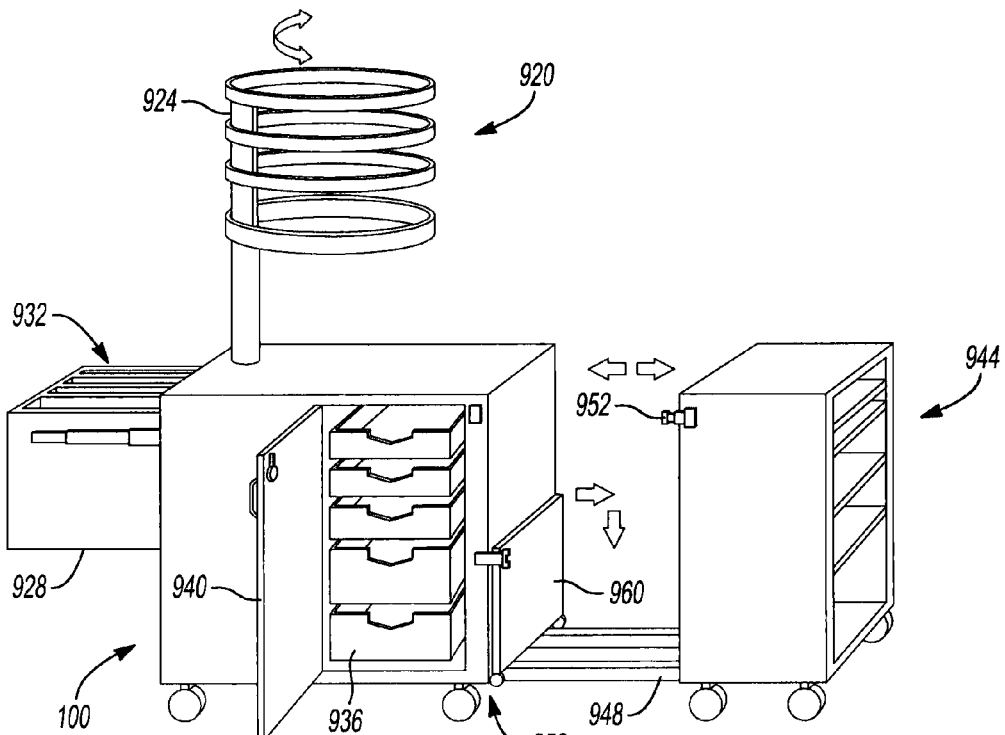
FIG. 10 shows another example service carts according to the principles of the present disclosure.
Figure 11:
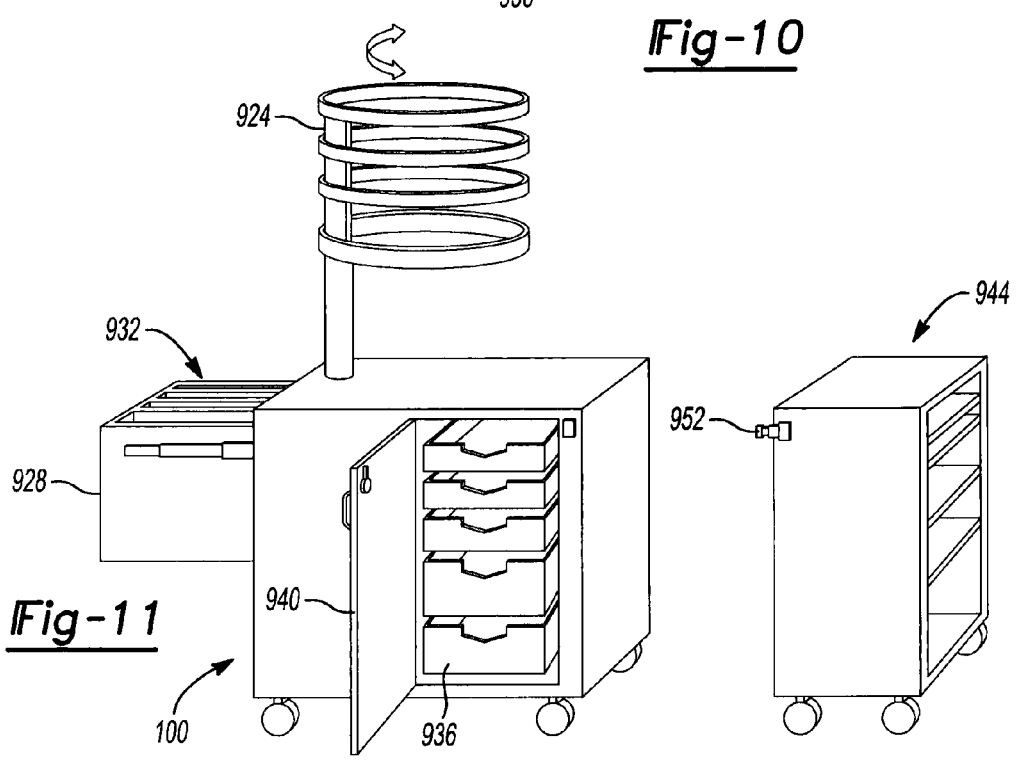
FIG. 11 shows another example service carts according to the principles of the present disclosure.
Figure 12:
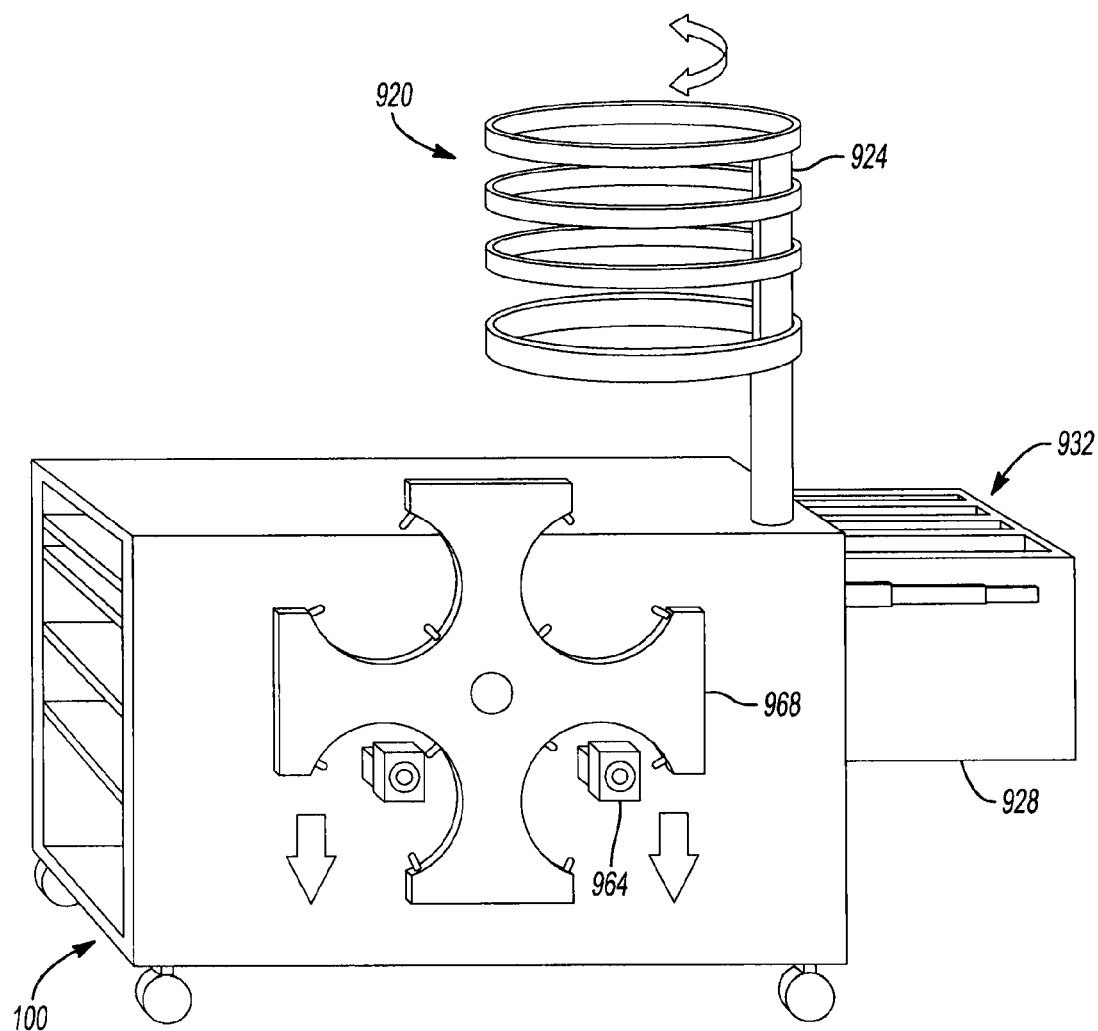
FIG. 12 shows another example service carts according to the principles of the present disclosure.

FIGS. 10-12 show other example configurations of the cart 100. In these examples, the cart 100 also includes showerhead trays 920 configured to store showerheads removed from a substrate processing system being serviced. The trays 920 are configured to be individually rotatable about an axis defined by post 924. For example only, the post 924 may be collapsible (e.g., telescoping, collapsible into an interior of the cart 100, etc.) such that the trays 920 can be collapsed downward when not in use.

The cart 100 may include a carrier ring storage drawer 928. The drawer 928 includes one or more slots 932 configured to receive respective carrier rings. The slots 932 may be lined with a protective material (e.g., Teflon, PTFE, etc.) to prevent damage to the carrier rings. The cart 100 may include a plurality of tool drawers 936 configured to store tools associated with service and maintenance of a particular type of substrate processing system. The cart 100 may include a lockable door 940 for securing the tool drawers 936.

The cart 100 may have a modular design configured to selectively receive and connect to additional cart segments 944. In FIG. 10, the cart segment 944 may be connectable to the cart 100 via rails 948 and/or one or more latches 952. For example, the rails 948 may be connected to the segment 944 and configured to slide into complementary slots 956 provided on a bottom surface of the cart 100 (or vice versa). When the segment 944 is in an extended position relative to the cart 100 as shown, the cart 100 and/or the segment 944 may include a tray 960 configured to be folded downward for storage (as shown) or unfolded to provide additional storage or work surface. Conversely, as shown in FIG. 11, the cart segment 944 may be connectable to the cart 100 using only the latches 952.

As shown in FIG. 12, a side of the cart 100 opposite the tool drawers 936 may include a pair of mounts or posts 964 arranged for hanging a transfer plate 968. The posts 964 may comprise metal, such as steel or aluminum, and may be coated with plastic or other material to prevent damage to the transfer plate 968. In some examples, the posts 964 may be hinged to fold upward when not in use.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected", "engaged", "coupled", "adjacent", "next to", "on top of", "above", "below", and "disposed". Unless explicitly described as being "direct", when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C".

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller", which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A service cart for storing a transfer plate of a substrate processing system, the service cart comprising:
   an upper surface;
   a first side, wherein the first side is vertically-oriented and perpendicular to the upper surface, wherein the first side includes
      a first mount and a second mount, wherein the first mount and the second mount are spaced apart to retain respective upper portions of the transfer plate, wherein each of the first mount and the second mount extends outward from the first side in a direction perpendicular to a plane defined by the first side, and wherein each of the first mount and the second mount includes a respective groove at least partially encircling the first mount and the second mount and located between the first side and respective ends of the first mount and the second mount, and
      a first bumper and a second bumper, wherein the first bumper and the second bumper are arranged on the first side below the first mount and the second mount; and
   a second side including at least one of a drawer and an opening to provide access to an interior of the service cart, wherein the second side is vertically-oriented and perpendicular to the upper surface.

2. The service cart of claim 1, wherein the interior of the service cart includes storage for carrier rings of the substrate processing system.

3. The service cart of claim 2, wherein the storage for the carrier rings includes at least one pair of ledges arranged to accept the carrier rings through the opening in the second side of the service cart.

4. The service cart of claim 3, wherein the at least one pair of ledges includes liners arranged to contact the carrier rings.

5. The service cart of claim 3, wherein the storage for the carrier rings includes a barrier arranged to retain the carrier rings on the at least one pair of ledges.

6. The service cart of claim 1, wherein the drawer is configured to store tools associated with servicing a wet clean optimization (WCO) deposition substrate processing system.

7. The service cart of claim 6, wherein the drawer includes cutouts having respective shapes corresponding to the tools.

8. The service cart of claim 7, wherein the cutouts include cutouts corresponding to minimum contact area (MCA) features of the substrate processing system.

9. The service cart of claim 1, wherein the opening is configured to accept a front opening unified pod (FOUP).

10. The service cart of claim 1, wherein the second side includes the drawer, storage for carrier rings arranged in the opening below the drawer, and storage for a front opening unified pod in the opening below the storage for the carrier rings.

11. The service cart of claim 10, wherein the second side includes a door arranged to selectively close the opening in the second side.

12. The service cart of claim 11, wherein:
   the second side includes a hinged latch arranged adjacent to a first side of the drawer;
   the hinged latch extends below the drawer into an upper portion of the opening;
   the hinged latch has an open position and a closed position;
   when the hinged latch is in the open position and the door is closed, the hinged latch does not prevent the drawer from being opened; and
   when the hinged latch is in the closed position and the door is closed, the door captures the hinged latch extended into the upper portion of the opening and the hinged latch prevents the drawer from being opened.

13. The service cart of claim 1, wherein each of the first mount and the second mount includes a hole and a fastener inserted through the hole to connect the respective one of the first mount and the second mount to the first side of the service cart.

14. The service cart of claim 13, wherein each of the first mount and the second mount includes a cap arranged over the hole.

15. The service cart of claim 1, wherein the first mount and the second mount comprise at least one of plastic, polyactic acid (PLA), high density polyethylene (HDPE), and Teflon.

16. The service cart of claim 1, wherein each of the first bumper and the second bumper is cone-shaped.

17. The service cart of claim 1, wherein each of the first bumper and the second bumper comprises rubber.

* * * * *